(12) United States Patent
Raj et al.

(10) Patent No.: US 10,190,701 B2
(45) Date of Patent: Jan. 29, 2019

(54) CORROSION CONTROL FOR CHAMBER COMPONENTS

(71) Applicant: Applied Materials, Inc., Santa Clara, CA (US)

(72) Inventors: Govinda Raj, Bangalore (IN); Hanish Kumar, Bangalore (IN); Lin Zhang, San Jose, CA (US); Stanley Wu, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 41 days.

(21) Appl. No.: 15/110,714

(22) PCT Filed: Apr. 6, 2016

(86) PCT No.: PCT/US2016/026156
§ 371 (c)(1),
(2) Date: Jul. 8, 2016

(87) PCT Pub. No.: WO2016/178777
PCT Pub. Date: Nov. 10, 2016

(65) Prior Publication Data
US 2017/0152968 A1 Jun. 1, 2017

(30) Foreign Application Priority Data

May 7, 2015 (IN) .......................... 2324/CHE/2015
Sep. 28, 2015 (IN) .......................... 5174/CHE/2015

(51) Int. Cl.
*F16K 41/10* (2006.01)
*H01L 21/687* (2006.01)
(Continued)

(52) U.S. Cl.
CPC .......... *F16K 41/10* (2013.01); *C23C 16/4404* (2013.01); *F16L 11/15* (2013.01);
(Continued)

(58) Field of Classification Search
CPC ..... F16K 41/10; F16L 11/15; H01J 37/32495; H01J 37/32477; H01L 21/68792; H01L 21/68757
See application file for complete search history.

(56) References Cited

U.S. PATENT DOCUMENTS 3,808,816 A * 5/1974 Lucas .................. F28D 15/00
138/DIG. 3
6,537,201 B1 * 3/2003 Kasic, II ............... A61L 27/30
600/25

(Continued)

FOREIGN PATENT DOCUMENTS

JP       11-236971 A      8/1999
JP       2009152534 A     7/2009
(Continued)

OTHER PUBLICATIONS

International Search Report and Written Opinion, PCT/US2016/026156, dated Jun. 30, 2016.

*Primary Examiner* — Ian Paquette
(74) *Attorney, Agent, or Firm* — Patterson + Sheridan, LLP

(57) ABSTRACT

Implementations described herein protect a chamber components from corrosive cleaning gases used at high temperatures. In one embodiment, a chamber component includes at least a bellows that includes a top mounting flange coupled to a bottom mounting flange by a tubular accordion structure. A coating is disposed on an exterior surface of at least the tubular accordion structure. The coating includes of at least one of polytetrafluoroethylene, parylene C, parylene D, diamond-like carbon (DLC), yttria stabilized zirconia, nickel, alumina, or aluminum silicon magnesium yttrium oxygen compound. In one embodiment, the chamber component is a valve having an internal bellows.

19 Claims, 6 Drawing Sheets

(51) Int. Cl.
 *H01J 37/32* (2006.01)
 *C23C 16/44* (2006.01)
 *F16L 11/15* (2006.01)
(52) U.S. Cl.
 CPC .. *H01J 37/32477* (2013.01); *H01J 37/32495* (2013.01); *H01L 21/68757* (2013.01); *H01L 21/68792* (2013.01)

(56) References Cited

U.S. PATENT DOCUMENTS

| | | | | |
|---|---|---|---|---|
| 7,744,060 | B2* | 6/2010 | Sneh | F16K 7/14 |
| | | | | 251/331 |
| 2007/0125494 | A1 | 6/2007 | Saigusa et al. | |
| 2009/0242043 | A1* | 10/2009 | Lev | H01M 8/04201 |
| | | | | 137/505.25 |
| 2012/0013077 | A1* | 1/2012 | Takahashi | F16J 15/363 |
| | | | | 277/391 |

FOREIGN PATENT DOCUMENTS

| KR | 101038541 B1 | 6/2011 |
|---|---|---|
| KR | 20150003434 A | 1/2015 |

\* cited by examiner

CORROSION CONTROL FOR CHAMBER COMPONENTS

BACKGROUND

Field

Implementations described herein generally relate to semiconductor manufacturing and more particularly to a chamber components for protecting vacuum processing equipment from corrosion.

Description of the Related Art

During the manufacture of semiconductor devices, a substrate may undergo many operations in a variety of processing chambers for the purpose of forming material layers and features suitable for an end use. For example, the substrate may undergo several depositions, annealing, and etching operations, among other operations. The process chambers are formed from a variety of components formed from aluminum containing compounds, steel containing compounds, nickel containing compounds, among other compounds. These compounds may additionally contain chromium, titanium and molybdenum among other materials.

Device miniaturization has made small dimensions for device patterns formed in a film layer of the substrate more critical. Achieving the critical dimensions in the substrate starts with a film layer of good quality and having good adhesion to underlying film layers in the substrate. To achieve a good quality film, the processing equipment is minimalizes processing chamber environmental contamination from affected or forming on substrates processed therein.

Complete disassociation of the process gases when forming plasma enhances the quality of films deposited on the substrate. Using high temperatures provides more complete disassociation of the process gases and also provides strong adhesion of the high quality film on the substrate. However, during continuous operation of the processing chamber, the corrosive agents in the chamber attack the chamber components and generate residual particles which increase the concentration of chromium, titanium and molybdenum in the interior volume of the processes chamber. Over time, the concentration of the residual particles in the interior volume of the processing chamber trend upward. The stray materials in the deposition environment may eventually find its way into the films deposited on the substrate and undesirably contribute to process contamination and process skew. To prevent process contamination and process skew, the process chamber environment may require monitoring and periodic cleaning.

Therefore, there is a need for to protect chamber components from corrosion.

SUMMARY

Implementations described herein protect a chamber components from corrosive cleaning gases used at high temperatures. In one embodiment, a chamber component in a form of a bellows is provided that includes a top mounting flange coupled to a bottom mounting flange by a tubular accordion structure. A coating is disposed on an exterior surface of at least the tubular accordion structure. The coating includes of at least one of polytetrafluoroethylene (PTFE), parylene C, parylene D, diamond-like carbon, yttria stabilized zirconia, alumina, or aluminum silicon magnesium yttrium oxygen compound.

In another example, a valve assembly is provided that includes a housing having a valve seat, an actuator coupled to the housing, a stem extending into the interior working volume of the housing, and a bellows circumscribing the stem. The stem is coupled to the actuator. The bellows isolates the stem from the interior working volume of the housing. The bellows has a coating exposed to an interior working volume of the housing.

In yet another example, a chamber component in a form of a shield is provided that includes a tubular body having a cylindrical inside wall having a diameter of at least about 0.75 inches. The tubular body has a top end and a bottom end. The cylindrical inside wall at the top end has a first engagement feature configured to engage a substrate support of a processing chamber.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Chamber components are disclosed which are resistant to corrosion. In one embodiment, a bellows of a substrate support is provided with a coating suitable for protecting the substrate support surfaces at high temperatures from the corrosive gases. The coating may be in the form of at least one plasma spray coating, 3D printing, cover plate, or other coating, which protects the bellows of the substrate support and significantly mitigate the formation of unwanted byproducts in the chamber environment resulting from attack by processing and/or cleaning gases on chamber components. In other embodiments, shields are employed to protect other chamber component from corrosion.

Figure 1:
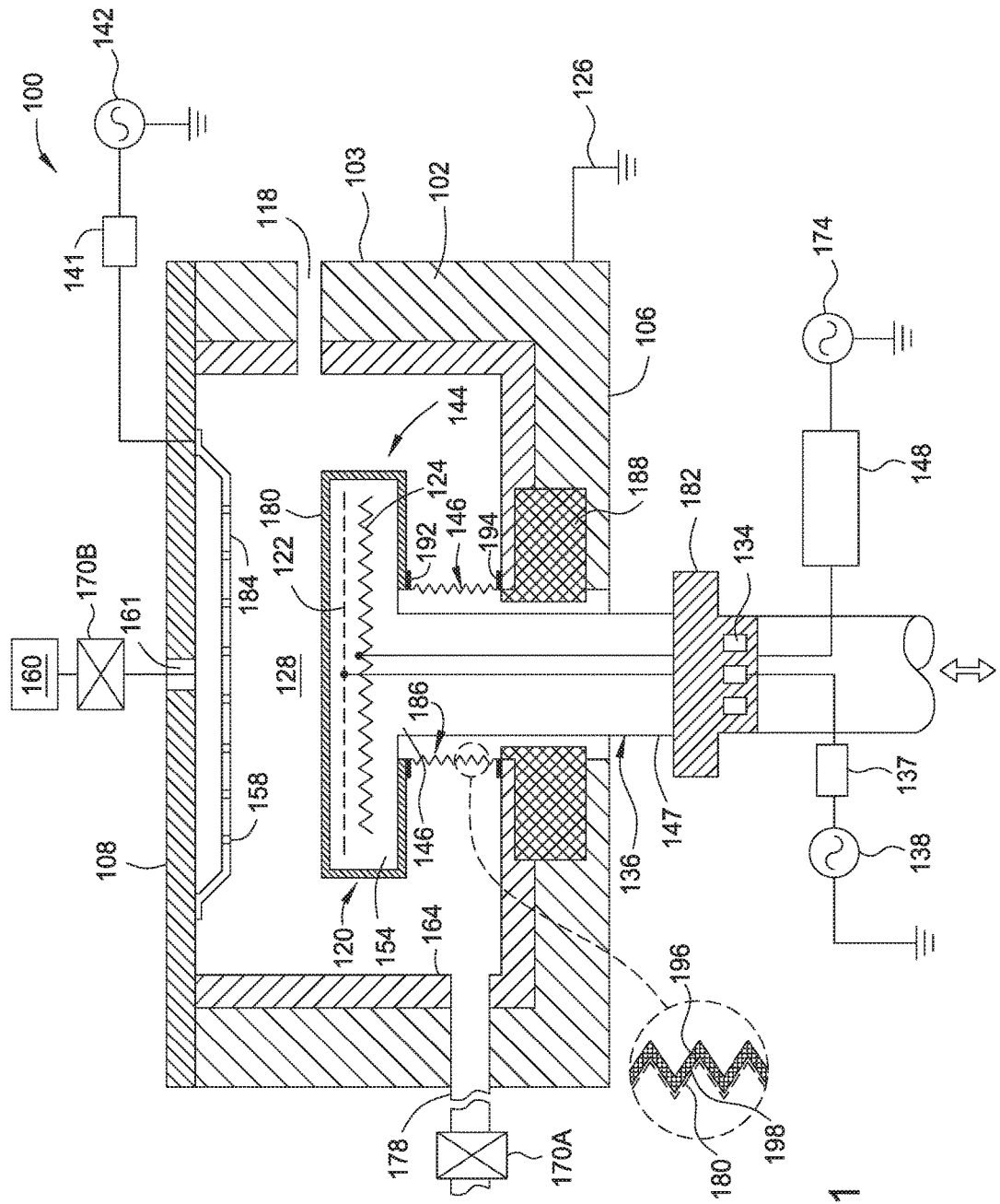
FIG. 1 is a cross-sectional schematic side view of a plasma processing chamber.

FIG. 1 is a cross-sectional schematic view of an exemplary processing chamber 100 having a substrate support assembly 144 for supporting a substrate during processing within a chamber body 102. The substrate support assembly 144 generally includes a substrate support 120 coupled to a shaft 136. The substrate support assembly 144 may be moveable vertically between an elevated position and a lowered position. A bellows 186 disposed inside the chamber body 102 and is coupled between the substrate support assembly 144 and the chamber body 102. The bellows 186 allows the substrate support assembly 144 to move vertically within the chamber body 102 while providing a vacuum seal to prevent leakage into the processing chamber 100. The shaft 136 of the substrate support 120 is disposed within the bellows 186 and thus isolated from the interior of the chamber body 102 which protects the shaft 136 from corrosion during processing. In one implementation, the processing chamber 100 is configured as deposition chamber. Although shown in the processing chamber 100 illustrated in FIG. 1, the substrate support 120 may be utilized in other processing chambers, for example plasma treatment chambers, physical vapor deposition chambers, etch chambers chemical vapor deposition chambers, and ion implantation chambers, among other processing chambers subject to corrosive processing and/or cleaning gases.

The processing chamber 100 includes a grounded chamber body 102. The chamber body 102 includes walls 103, a bottom 106 and a lid 108 which enclose an internal chamber volume 128. The chamber body 102 is coupled to a ground 126. A protective liner 164 is disposed in the internal chamber volume 128 to protect the walls 103 of the processing chamber 100. The protective liner 164 and walls 103 having an opening 118 through which a substrate (not shown) may be robotically transferred into and out of the internal chamber volume 128.

A pumping port 178 is formed in one of the walls 103 or the bottom 106 of the chamber body 102. The pumping port 178 fluidly connects the internal chamber volume 128 to a pump valve assembly 170A. The pump valve assembly 170A is connected to a pumping system (not shown). The pumping system is utilized to maintain a vacuum environment within the internal chamber volume 128 of the processing chamber 100, while removing processing byproducts and corrosive gases from the internal chamber volume 128. The pumping system and chamber thermal design enables high base vacuum (about $1 \times E^{-8}$ Torr or less) and low rate-of-rise (about 1,000 mTorr/min) at temperatures suited to thermal budget needs, e.g., about −25 degrees Celsius to about +500 degrees Celsius. The pumping device enables a vacuum pressure between 10 and 30 mT.

The pump valve assembly 170A may be configured to control the fluid flow through the pumping port 178 to the pumping system. For example, when the processing chamber 100 is in operation, the pump valve assembly 170A may be in an open state to allow the internal chamber volume 128 of the processing chamber 100 to be evacuated through the pumping port 178 by the pumping system. When the processing chamber 100 is idled or vented for service, the pump valve assembly 170A may be in a closed state to isolate the internal chamber volume 128 of the processing chamber 100 from the pumping system. In one embodiment, the pump valve assembly 170A has corrosion protection to protect the pump valve assembly 170A from damage due to the corrosive gases exiting the internal chamber volume 128 through the pumping port 178.

A gas source 160 is coupled through a gas valve assembly 170B to the processing chamber 100. The gas source 160 provides process gases through the gas valve assembly 170B and into the internal chamber volume 128 through an inlet 161 formed through the chamber body 105 or lid 108. The gas valve assembly 170B may be configured to control the fluid flow through the inlet 161 into the internal chamber volume 128. In one or more embodiments, process gases may include halogen-containing gases, such as fluorine gas and/or chlorine (Cl) gas. Alternately, the process gases may include deposition gases such as, for example, gases that include carbon (C), silicon (Si), oxygen (O), nitrogen (N), combinations thereof or other suitable gases. The gas source 160 also provides cleaning gases utilized to clean components present in or exposed to the internal chamber volume 128 of the processing chamber 100. Examples of cleaning gases which may be provided by the gas source 160 include halogen-containing gases, such as a fluorine gas, a fluorine-containing gas, a chlorine gas and/or a chlorine-containing gas.

The pump valve assembly 170B may be configured to control the fluid flow gas source 160 through the inlet 161 into the internal chamber volume 128 of the processing chamber 100. For example, when the processing chamber 100 is in operation, the pump valve assembly 170B may be in an open state to allow process gases from the gas source 160 to be provided into the internal chamber volume 128 of the processing chamber 100 through the inlet 161. When the processing chamber 100 is idled or vented for service, the pump valve assembly 170B may be in a closed state to isolate the internal chamber volume 128 of the processing chamber 100 from the gas source 160. In one embodiment, the pump valve assembly 170B has corrosion protection to protect the pump valve assembly 170B from damage from the gases flowing into the internal chamber volume 128 through the inlet 161.

The pump valve assembly 170A and the gas valve assembly 170B may both be exposed to corrosive agents and have controls for mitigating damage due to the corrosive agents. The pump valve assembly 170A and the gas valve assembly 170B may be similar in mechanics or operation and similarly benefit from erosion control. A valve assembly 170 illustrated in FIG. 6 may be generic to both the pump valve assembly 170A and the gas valve assembly 170B. The corrosion controls on the valve assembly 170 is discussed below with regard to FIG. 6.

A showerhead 184 may be coupled to the lid 108 of the processing chamber 100. The showerhead 184 has a plurality of gas delivery holes 158 for distributing process gases entering through the inlet 161 into the internal chamber volume 128. The showerhead 184 may be connected to an RF power source 142 through a match circuit 141. The RF power provided by the RF power source 142 to the showerhead 184 energizes the process gases exiting the showerhead 184 for maintaining plasma between the showerhead 184 and substrate support assembly 144 within the internal chamber volume 128.

The substrate support assembly 144 is disposed in the internal chamber volume 128. The substrate support assembly 144 includes a substrate support 120 coupled to a shaft 136. The substrate support 120 supports a substrate thereon during processing. The substrate support 120 may comprise a dielectric body 154. The dielectric body 154 may be formed from stainless steel or a nickel chromium alloy such as INCONEL® 625. The dielectric body 154 may be formed from ceramic material, aluminum nitride, yttria alumina garnet, or other suitable alloy having chromium, molybdenum, titanium or other metal. The dielectric body 154 may optionally have an aluminum core coated with a dielectric material.

A cathode electrode 122 is embedding within the dielectric body 154 of the substrate support 120. The cathode electrode is connected to an RF power source 138 through an integrated match circuit 137. The cathode electrode 122 capacitively couples power to the plasma from below the substrate disposed on the substrate support 120. In one embodiment, the RF power source 138 provides the cathode electrode 122 with between about 200 Watts to about 1000 Watts of RF power. The RF power source 138 may also be coupled to a system controller (not shown) for controlling the operation of the cathode electrode 122 by directing a DC current to the cathode electrode 122 for chucking and de-chucking the substrate.

The substrate support 120 may include one or more resistive heaters 124 embedded in the dielectric body 154. The resistive heaters 124 are coupled through an RF filter 148 to a heater power source 174. The resistive heaters 124 may be provided to elevate the temperature of the substrate support 120, and substrate disposed thereon, to a temperature for conducting substrate processing.

The shaft 136 of the substrate support assembly 144 includes a top end 146 which couples to the body 154 of the substrate support 120. The shaft 136 may be disposed through a flange 188 in the bottom 106 of the processing chamber 100. The shaft 136 may be formed from an alloy containing chromium, titanium, molybdenum or other metal. In one embodiment, the shaft 136 is formed from stainless steel. In another embodiment, the shaft 136 is formed from INCONEL® 625.

A thermal isolator 182 is coupled to, or around, a bottom portion 147 of the shaft 136. The thermal isolator 182 may have cooling channels 134 to prevent heat from the substrate support 120 from conducting down through the shaft 136 to components outside of the processing chamber 100. Additionally, the flange 188 may have thermally conductive material embedded therein to prevent heat from conducting to the outside of the processing chamber 100. The thermal isolation of the substrate support 120 from the outside environment allows better temperature control of the substrate support assembly 144. Passages may be formed through the thermal isolator 182 for routing conductors to the resistive heaters 124 and the cathode electrode 122, and for routing backside gas to the top of the substrate support 120 on which the substrate is supported.

The substrate support assembly 144 may be movably coupled to the chamber body 102. The substrate support assembly 144 may be movable between an upper position (closer to the showerhead 184 for processing) and a lower position (aligned or below the opening 118 to facilitate substrate transfer). The bellows 186 may provide a flexible seal between the substrate support 120 and chamber body 102. The bellows 186 may have a body 196. The body 196 may have a cylindrical shaped tubular accordion structure. The body 196 has an outer surface 198. The outer surface 198 may be exposed to the internal chamber volume 128. A top 192 of the body 196 may contact an underside of the substrate support 120. A bottom 194 of the body 196 may contact the chamber body 102. The top 192 and bottom 194 may form a vacuum seal and prevents the process gases from leaking from the internal chamber volume 128 out of the chamber body 102. The bellows 186 may shield chamber components, such as the shaft 136, from corrosive plasma and/or heat in the internal chamber volume 128. The bellows 186 may also protect the thermal isolator 182, the flange 188, or some other portions of the substrate support assembly 144 from the chamber environment. The body 196 of the bellows 186 may be formed from materials containing titanium, molybdenum, and/or chromium, such as stainless steel, nickel-chromium alloys, for example Inconel 625, or other suitable material. In one embodiment, the bellows 186 are formed from stainless steel. In another embodiment, the bellows 186 are formed from a nickel-chromium alloy containing molybdenum and niobium, such as Inconel 625.

One or more chamber components have a coating 180 utilized to protect the component from the corrosive environment within the internal chamber volume 128 of the processing chamber 100. For example, the coating 180 may be disposed on the substrate support 120. The coating 180 may be multilayered and in the form of a thin film, plating, spray coating, or other material coating disposed directly on the exterior of the substrate support 120. The coating 180 may additionally, or alternately, be formed on other chamber components, such as the outer surface 198 of the bellows 186. The coating 180 may be monolithic and comprise materials which can be conformally deposited, such as polytetrafluoroethylene (PTFE), parylene C, parylene D, diamond-like carbon, or selective coatings of ceramic such as yttria stabilized zirconia or alumina, or aluminum silicon magnesium yttrium oxygen compound, or other material suitable for protecting the substrate support assembly 144 from corrosive gases in the processing chamber 100. Alternately, the coating 180 may have multiple layers. The multiple layers of the coating 180 may be formed from one or more of the aforementioned suitable coating materials. For example, the multiple layers may include two or more layers such as a bond layer and a protective layer. The bond layer may be suited to the chamber component to promote adhesion thereto while the protection layer may be provide insulation of said chamber component from the corrosive chamber environment or high temperatures among other chamber hazards. The bond layer reduces the coefficient of thermal expansion mismatch between the chamber component and the protective layer to improve adhesion. The coefficient of thermal expansion mismatch is lower between the underlying chamber component and the bond layer and therefore the bond layer promotes good adhesion to the underlying chamber component. The bond layer allows the formation of the protection layer on the chamber component as the protection layer which is exposed to the interior of chamber. The protection layer is configured to have good mechanical properties and corrosion resistance for protecting the chamber component.

A Ni coating of up to 10 microns thick may be applied as the bond layer which has good mechanical and chemical properties. For example, a DLC protective layer may have a bond layer having Ni, Cr, Ti, NiCrAl, CrNiCoAl, MoCr-NiAl, or other suitable alloys. In one embodiment, the bond layers are of a xCrAl or xTi alloy material, where x is cobalt, nickel, or a combination of cobalt and nickel, for DLC protective coatings. The DLC protective coating layer may have a thickness which is proportional to the Bond layer. The DLC layer thickness to bonding layer thickness may be in a range of about 1/3:2/3 or about to 50:50. For example, the thickness of the DLC layer may be less than about 5 microns, such as between about 2 microns to about 3 microns. In such an example, the Ni bond layer may have a thickness of less than about 12 microns. The Multilayer has improved mechanical properties, improved wear properties, and good adhesion. Additionally, a layer may be used as a wear indicator. The layer may be measured with a spectrometer, photometer, or other instrument to detect when a layer may need to be cleaned or replaced.

The coating 180 may be applied by plasma sprayed, dipping, electrostatic powder coated, or applied in another suitable method to the chamber components. Alternately, the coating 180 may be deposited while 3D printing the chamber components. For example, the chamber component may be fully printed using a process of direct metal laser sintering with a final layer being the coating 180. The coating 180 may have a thickness of about 0.5 microns to about 50 microns, such as about 8 microns. The coating material may further be thermally treated to a temperature between about 650 degrees Celsius and about 1,100 degrees Celsius for improving adhesion strength to the base material underlying coating layer, i.e., the substrate support 120, bellows 186 and/or other chamber component. The thermal treatment may last for up to 10 hours to ensure good adhesion of the coating material to the base material of the chamber component.

In one embodiment, a nitrogen triflouride cleaning gas is introduced into the processing chamber 100 to form a plasma for cleaning the internal chamber volume 128 of the processing chamber 100. The temperature of the top surface of the substrate support 120 is maintained at a temperature in excess of about 400 degrees Celsius. Chromium, titanium, molybdenum and/or other byproducts may form in the internal chamber volume 128 of the processing chamber 100 from chamber components in the presence of corrosive processing gases, particularly when exposed to temperatures higher than about 400 degrees Celsius. The coating 180 protects the chamber components from reacting with the corrosive processing gases and forming chromium, titanium, and/or molybdenum contamination in the internal chamber volume 128 which may adversely affect substrates processed therein.

Figure 2:
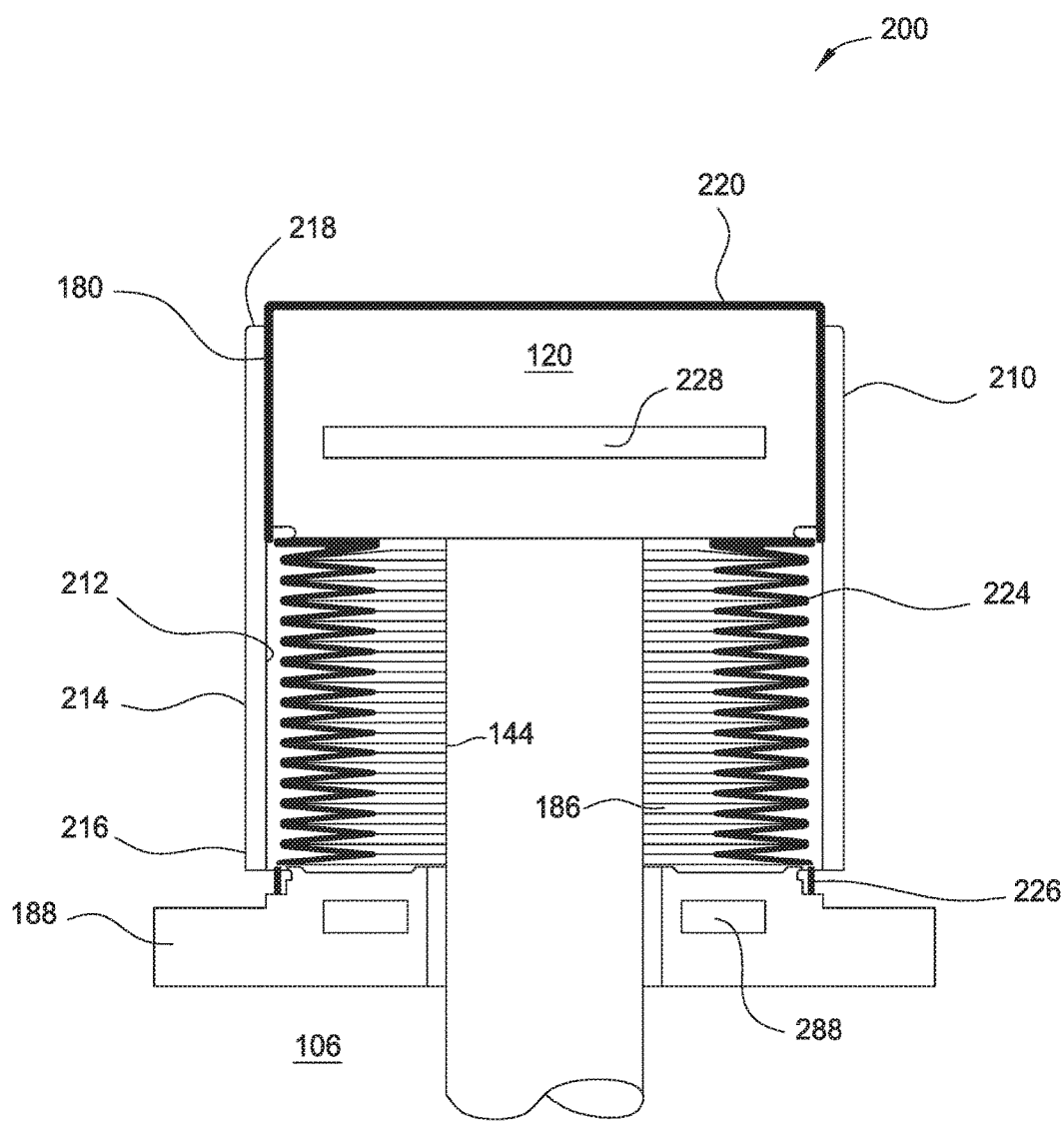
FIG. 2 illustrates a side plan view of a substrate support assembly in the plasma processing chamber having bellows with a corrosion protective coating.

Different solutions are provided herein which protect the chamber components, such as the substrate support 120 and/or bellows 186, from the corrosive processing gases of the processing chamber 100. A first example is depicted in FIG. 2. FIG. 2 illustrates a side plan view of the substrate support assembly 144 having corrosion protection for the bellows 186 to prevent the corrosion of the bellows 186 and the introduction of contamination into the internal chamber volume 128, i.e., the processing environment, of the processing chamber 100. The corrosion protection may include one or more of a shield 210, thermal breaks 228, 288 and/or cooling channels 320, 380 (shown in FIG. 4).

The shield 210 may protect the bellows 186 of other components of the substrate support assembly 144 from plasma corrosion or high temperatures. The shield 210 may have a hollow cylindrical shape. The shield 210 has an inner diameter 212 and an outer surface 214. The inner diameter 212 may be sized to form an opening suitable to accept the substrate support 120 therein. The shield 210 may be attached to the substrate support 120 at a fixed end 218. The shield 210 may also have a free end 216 which is not in contact with the chamber body or the flange 188. The shield 210 may move up and down with the movement of the substrate support 120. The shield 210 may be formed from aluminum, stainless steel, nickel, Inconel 625, yttria, or other suitable material. In one embodiment, the shield 210 has the coating 220 applied to the outer surface 214. The coating 180 may be a multilayer coating such as a bond layer near or at the outer surface 214 and a protective layer disposed on the bond layer. The bonding layer may be between about 0.5 microns thick and about 5 microns thick, such as about 1.5 microns thick. The protective layer may be between about 2 microns thick and about 20 microns thick, such as about 2.5 microns thick. The coating 180 may protect the shield 210 from plasma corrosion which may contribute contamination to the chamber processing environment and/or protect against the high chamber temperatures.

The coating may be disposed on one or more of the chamber components. The substrate support 120 may have a coating 220. The bellows 186 may have a coating 224. One or more portions of the flange 188 may also have a coating 226. The coatings 220, 224, 226 may be substantially similar to coating 180 described above. The individual coatings 220, 224, 226 may be formed from different materials or thicknesses on the respective chamber components depending on reasons such as local temperatures, exposure to corrosive agents, the underlying material, requirements for elasticity, requirements for flexibility, or other factors. For example, the coating 220 on the substrate support 120 may be formed thicker than the coating 224 formed on the bellows 186 as the coating 224 needs to be more flexible due to the repeated expanding and contracting motion of the bellows 186.

In some embodiments, the bellows 186 is protected from the corrosive processing gases and high temperatures by the coating 224. In other embodiments, the bellows 186 is protected from the corrosive processing gases and high temperatures by one or more of the coating 224, the shield 210 or thermal breaks 228, 288. The protection provided by the coating 224 prevents contamination, such as chromium, titanium and/or molybdenum particles, from accumulating in the internal volume of the processing chamber and contaminating the films deposited on substrates therein. The following discussion will center on the substrate support assembly 144 and the bellows 186. However, it should be appreciated that the protection afforded to the substrate support assembly 144 and the bellows 186 by the coatings may be utilized to other processing chamber components that are subject to corrosion.

In a first embodiment, the coating 180 and the shield 210 are used to protect the substrate support 120, the flange 188, and bellows 186. The substrate support 120 and bellows 186 may be formed from nickel-chromium alloy. The shield 210 may be formed from aluminum, such as 6061-T6. The coating 180 may be formed from a polytetrafluoroethylene (PTFE), or parylene C or D material. The coating 180 may be from about 0.5 microns to about 50.0 microns, such as about 5 microns. The polytetrafluoroethylene (PTFE), or parylene C or D material may be chemical vapor deposited to form multiple layers, and may optionally have a bonding layer disposed therebetween. The coating 180 may be a very thin and conformal top layer, and for example, may be deposited using physical vapor deposition and/or chemical vapor deposition. The coating 180 is formed on the substrate support 120 and the bellows 186. The coating 180 on the substrate support 120 may be continuous and extend to and cover the bellows 186 as a unitary single coating. For example, the substrate support 120 and bellows 186 may assembled together and the coating 180, i.e., coating 220, 224, is plasma sprayed on the substrate support 120 and bellows 186 in a single application. Alternately, the coating 220 on the substrate support 120 and the coating 224 on the bellows 186 may be formed separately such that the coatings 220, 224 are not continuous across the substrate support 120 and bellows 186. For example, prior to the assembly of the bellows 186 to the substrate support 120, the coating 220 may be formed on the substrate support 120 during one operation and the coating 224 is formed on the bellows 186 in a separate operation.

In a second embodiment, the coating 224 on the bellows 186 is formed from a diamond-like carbon or a ceramic material such as yttria stabilized zirconia or alumina or AsMy. The coating 224 may have a thickness of about 0.5 microns to about 50.0 microns, such as about 5 microns for DLC and about 25 microns for ceramic. The diamond-like carbon or ceramic material may be chemical vapor deposited with multilayers having a bonding layer in between. A very thin and conformal top layer may be deposited using physical vapor deposition or chemical vapor deposition to cover any pours. The coating 220 of the substrate support 120 may be formed from polytetrafluoroethylene (PTFE), or parylene C or D, the diamond-like carbon or a ceramic material or a metal, such as a nickel coating. The coating 220 may have a thickness of about 0.5 microns to about 50.0 microns, such as about 12 microns. The coating 220 may be plasma sprayed with multilayers having a bonding layer in between and a thin conformal top layer. The bellows 186 are formed from a nickel-chromium alloy and protected from the corrosive processing gases and high temperatures by the coating 224 and the shield 210.

Figure 3:
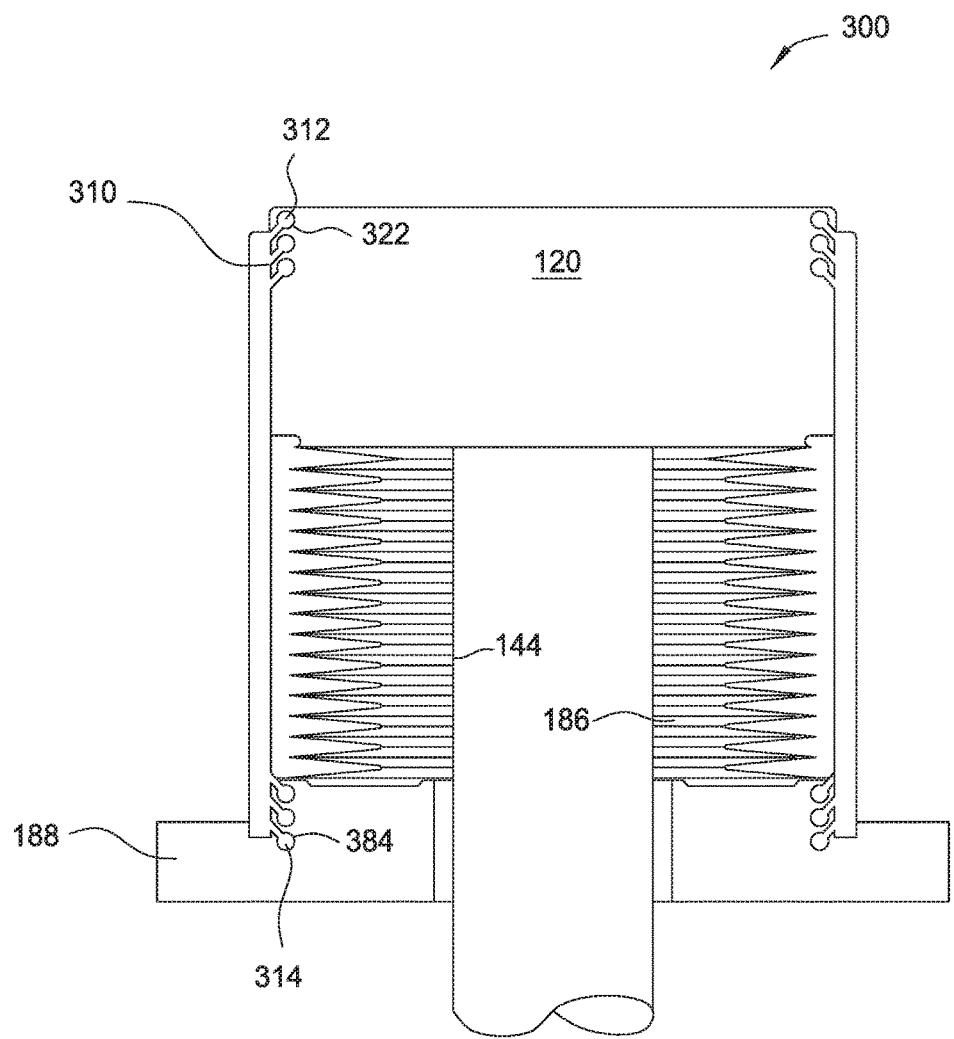
FIG. 3 illustrates another side plan view of the substrate support assembly in the plasma processing chamber having a flexible shield for corrosion protection.

In a third embodiment, the bellows 186 are formed from Inconel 625 and protected from the corrosive processing gases and high temperatures by a flexible shield 310. FIG. 3 illustrates a side plan view of another substrate support assembly 300 for use in the plasma processing chamber 100. The substrate support assembly 300 has the flexible shield 310 for corrosion protection of the bellows 186. The flexible shield 310 may be made from polytetrafluoroethylene (PTFE) or other suitable material. The flexible shield 310 may have a snap seal 312 at one end and a second snap seal 314 at a second end. The substrate support 120 may have a feature 322 for interfacing with the snap seal 312. Additionally, a second feature 384 may be disposed on the flange 188 for interfacing with the second snap seal 314. The snap seals 312, 314 and features 322, 384 may be in the form of a male/female interface, ball and socket, or other two part fastening system for sealingly joining to components. The snap seals 312, 314 create a fitted flexible labyrinth seal to the features 322, 384 to prevent corrosive material from entering the space of the bellows 186. Advantageously, the flexible shield 310 is easy to install and prevents contamination by mitigating the corrosion of the bellows 186 while prolonging the life cycle of the bellows 186.

Figure 4:
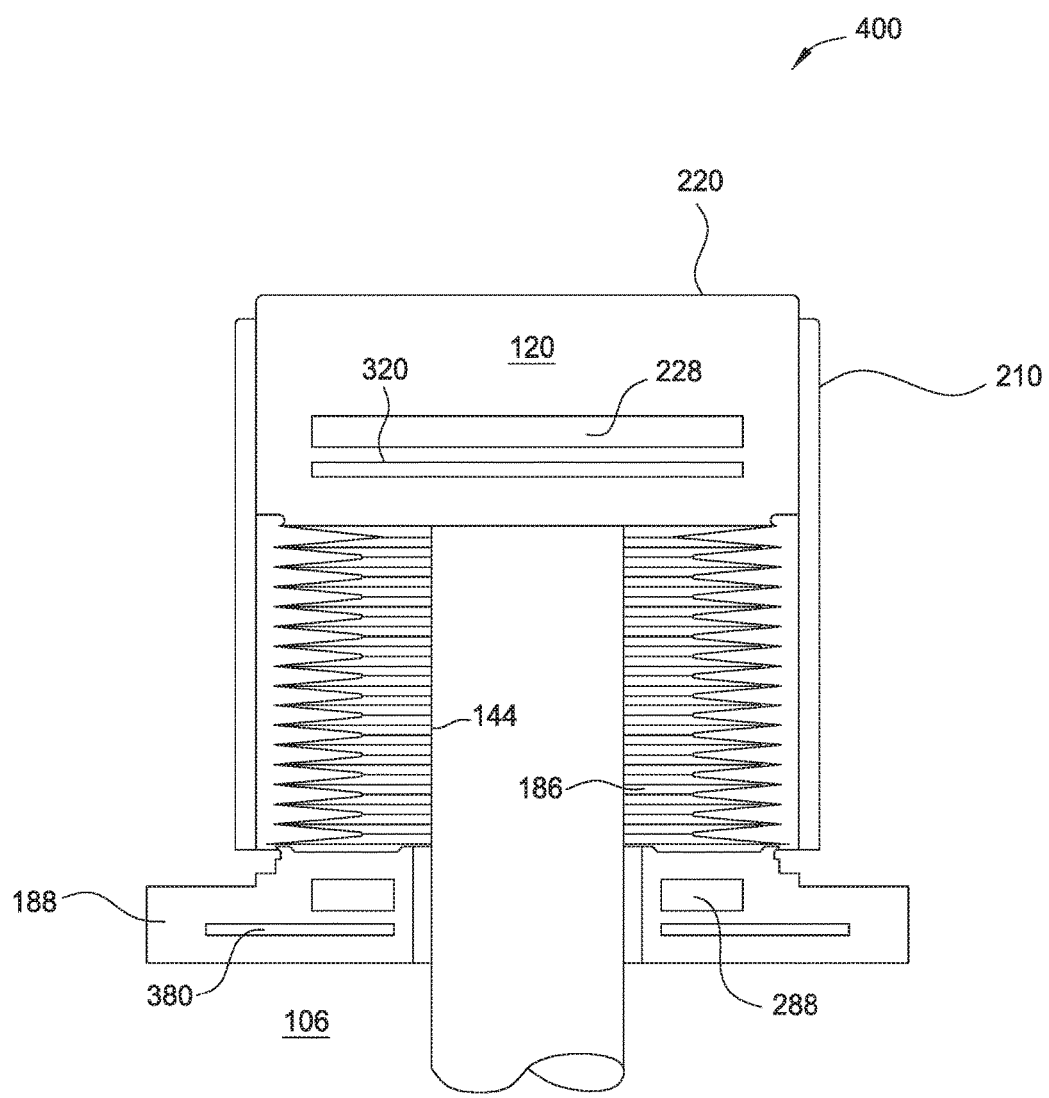
FIG. 4 illustrates another side plan view of the substrate support assembly in the plasma processing chamber having thermal barriers for corrosion protection.

FIG. 4 illustrates another side plan view of another substrate support assembly 400 for use in the plasma processing chamber 100. The substrate support assembly 400 has thermal barriers for reducing the temperature of the bellows 186 and flange 188. The thermal barrier may consist of thermal breaks 228, 288 and/or the cooling channels 320, 380. The flange 188 and bellows 186 get heated during processing due to the high processing temperatures, such as temperatures exceeding 300 degrees Celsius. The thermal breaks 228, 288 interrupt the thermal conducting path through the substrate support assembly 400. The thermal breaks 228, 288 may be made of a low thermally conductive material which is 3D printed, sandwiched or coated in the substrate support 120 and flange 188. For example, high thermal conductive graphene or metal foils can be casted or 3D printed or bonded in multiple layers in the substrate support 120 and flange 188 for maintaining a lower temperature at the bellows 186. The thermal breaks 228, 288 may be from multiple layers and have a total thickness of about 1 micron to about 30 microns, such as about 15 microns. The cooling channels 320, 380 may be 3D printed when fabricating the substrate support 120 or flange 188. The cooling channels 320, 380 may be used to maintain the bellows 186 at a desired temperature to reduce metal contamination. During metal 3D printing of the chamber components, the Z axis growth may be paused to insert the high thermal conductive nano or micro Graphene foils.

In a fourth embodiment, the bellows 186 are formed from a nickel-chromium alloy and protected from the high process temperatures by the thermal breaks 228, 288. One or more of the thermal breaks 228, 288 may be formed from graphene, and may have a thickness, for example, from about 0.5 microns to about 750 microns. The shield 210 may also protect the bellows 186. The shield 210 may be formed from aluminum, such as 6061-T6 aluminum. In a fifth embodiment, the bellows 186 are formed from a nickel-chromium alloy and protected by two or more layers of thermal breaks 228 formed from graphene or metal foils in the substrate support, two or more layers of thermal breaks 228 formed from graphene or metal foils in the flange 188, and the shield 210. In a sixth embodiment, the bellows 186 are formed from a nickel-chromium alloy and protected from high process temperatures by two or more layers of thermal breaks 228 and cooling channels 320 formed in the substrate support, two or more layers of thermal breaks 228 and cooling channels 380 formed in the flange 188, and the shield 210.

Figure 5:
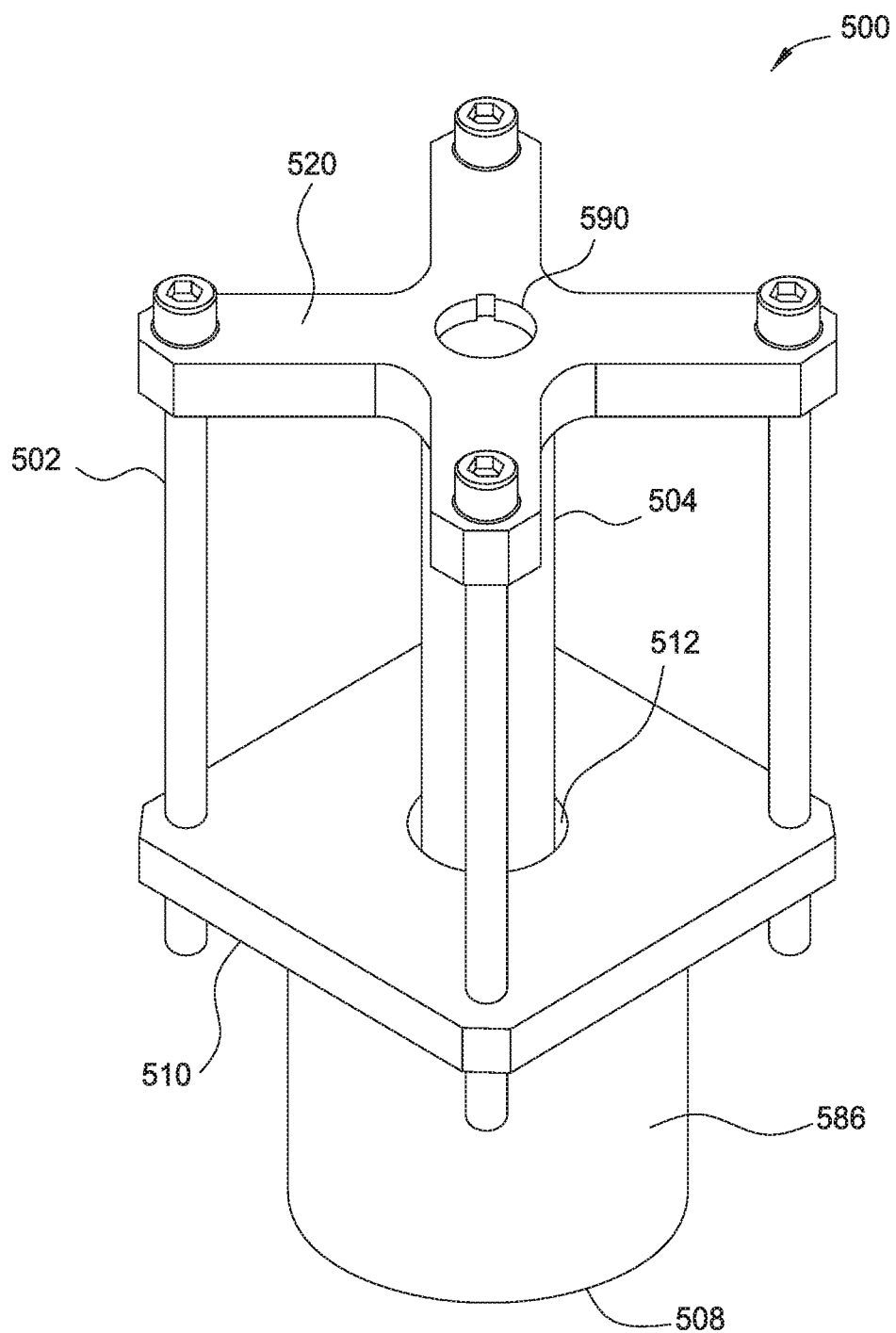
FIG. 5 illustrates a side plan view of a bellows holding device used for cleaning and applying the protective coating to the bellows

FIG. 5 illustrates a side plan view of a bellows holding device 500 used for cleaning and applying the protective coating 180 to the bellows 186. The bellows holding device 500 may be rotatable and used in chambers applying plasma spray coatings and/or CVD and/or agents for cleaning the bellows 186. The bellows holding device 500 may be suited for surface preparation of the bellows 186, such as cleaning, degreasing prior to forming a uniform multilayered coating, such as a bond layer and a protective layer on the bellows.

The bellows holding device 500 may consist of a frame 586 attached to a bracket 502. The frame 586 is configured to be disposed inside the bellows 186 and hold the bellows 186 during cleaning and/or applying the protective coating 180. The frame 586 has a top end 508 and a bottom end 512. The bellows 186 is transferable on and off the frame 586 at the top end 508. The bottom end 512 of the frame 586 attaches to the bracket 502.

The bracket 502 has a plate 510, struts 504 and a support 520. The plate 510 may be attached to the bottom end 512 of the frame 586 holding the bellows 186. The plate 510 is attached to the support 520 by the struts 504. In one embodiment, the plate 510 or support 520 is moveable along the struts 504 relative to each other. Movement of the plate 510 may effect a length of the frame 586 for fully extending bellows 186 disposed on the frame. In this manner the bellows 186 will present a flat cylindrical surface for processing. In another embodiment, the plate 510 and support 520 are fixed relative to each other. The support 520 may optionally have an attachment 590, such as a keyed hole, for accepting a motor or rotary device for spinning the bellows holding device 500 while the bellows holding device 500 has bellows 186 attached thereto and is undergoing processing. The rotary arrangement may rotate the bellows holding device 500 either clockwise or counterclockwise for control the uniformity of the thickness of the coating 180. Advantageously, the wear for the coating 180 may be more predictable and the bellows 186 may be serviced before corrosion of the bellows 186 contaminates the inner volume of the processing chamber during processing subtracts therein.

Figure 6:
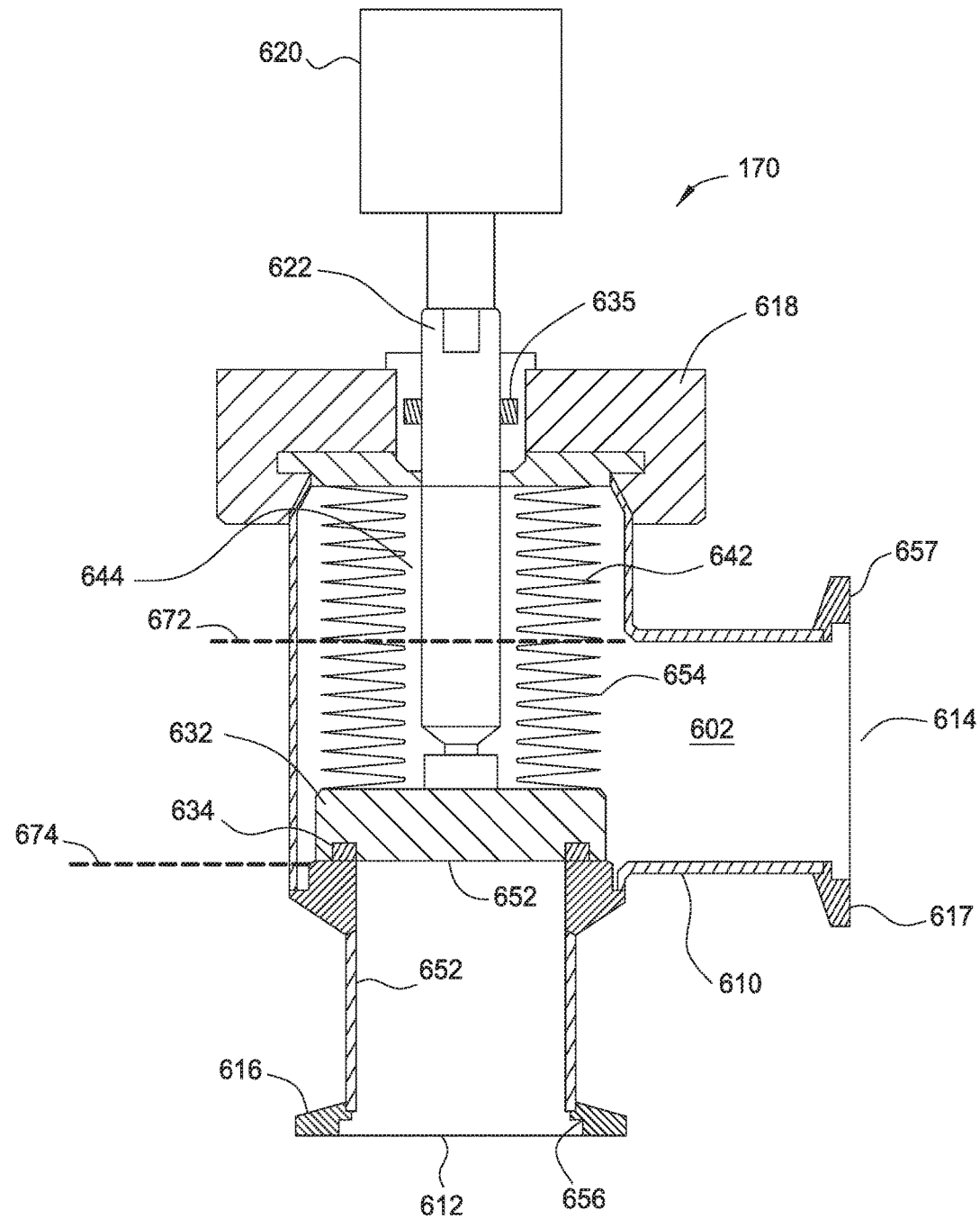
FIG. 6 illustrates a cross-sectional view of a valve assembly having corrosion protection.

FIG. 6 illustrates a cross-sectional view of the valve assembly 170 having corrosion protection. Although shown in the processing chamber 100 illustrated in FIG. 1, the valve assembly 170 may be utilized in other processing chambers, for example plasma treatment chambers, physical vapor deposition chambers, etch chambers chemical vapor deposition chambers, and ion implantation chambers, among other processing chambers subject to corrosive processing and/or cleaning fluids. Additionally, although the valve assembly 170 depicted in FIG. 6 is of a globe valve, it should be appreciated that the corrosion control disclosed for valve assembly 170 is equally applicable to other types of valve assemblies such as butterfly valves, ball valves, diaphragm valves, gate valves and other valve assemblies suitable for having corrosive agents pass therethrough.

The valve assembly 170 has a housing 610. The housing 610 may be formed from stainless steel, such a 304 SST, INCONEL® 625, Haynes 242, or other suitable material. The housing 610 has an inlet 612 and an outlet 614 formed therein. The housing 610 additionally has an interior working volume 602. When the valve assembly 170 is in an open state, fluid may flow in to the interior working volume 602 from inlet 612 and exit the housing 610 from the outlet 614.

In one or more embodiments, the housing 610 may have a valve body coating 650. The valve body coating 650 may protect the interior working volume 602 of the housing 610 from corrosive agents such as cleaning gases, processing gases and the like.

The inlet 612 may have a flange 616 for providing a fluid tight seal. The flange 616 may provide a seal for fluidly coupling the housing 610 to the processing chamber 100 or components thereof, such as the pumping port 178. The flange 616 may be formed from stainless steel, such a 304 SST, INCONEL® 625, Haynes 242, or other suitable material. The flange 616 may have a flange coating 656. The flange coating 656 is configured to protect the flange 616 from corrosive agents entering in the inlet 612. In one embodiment, the flange 616 at the inlet 612 is fluidly attached to the pumping port 178 of the chamber body 102. In another embodiment, flange 616 at the inlet 612 is fluidly attached to the gas source 160.

The outlet 614 may also have a flange 617. The flange 617 may provide a seal and fluidly attach the housing 610 to the processing chamber 100 or component thereof. The flange 617 may be formed from stainless steel, such a 304 SST, INCONEL® 625, Haynes 242, or other suitable material. The flange 617 may have a flange coating 657. The flange coating 657 is configured to protect the flange 617 from corrosive agents entering leaving through the outlet 614. In one embodiment, the outlet 614 is fluidly attached to the chamber body 102 or plumbing attached thereto such as the inlet 161 to the internal chamber volume 128. In another embodiment, the outlet 614 is fluidly coupled to the vacuum.

The housing 610 may have a bonnet 618. The bonnet 618 may be attached to the housing 610 by fasteners, adhesives, welding, or by other suitable means. In one embodiment, the bonnet 618 is attached to the housing 610 with screw type fasteners. The bonnet 618 forms a seal with the housing 610 such that fluids in the interior working volume 602 do not exit the housing 610 at or from the bonnet 618. The bonnet 618 may be fabricated from material similar to the housing 610. For example, the bonnet 618 may be formed from stainless steel, such a 304 SST, INCONEL® 625, Haynes 242, or other suitable material.

A center opening 635 may be disposed through the central portion of the bonnet 618. The center opening 635 may be configured to accept and support a stem 622 therethrough. The stem 622 may be moveable through the center opening 635. The stem 622 may extend through the bonnet 618 into the interior working volume 602 of the housing 610. The stem 622 may be formed from stainless steel, such a 304 SST, INCONEL® 625, Haynes 242, or other suitable material.

An actuator 620 may be attached to one end of the stem 622. The actuator 620 may be a knob and screw, a solenoid, a pneumatic or hydraulic cylinder, a motor or other actuator suitable to linearly displace the stem 622. A valve plug 632 may be attached to the other end to the stem 622 that is disposed in the interior working volume 602 of the housing 610. The valve plug 632 may be formed from stainless steel, such a 304 SST, INCONEL® 625, Haynes 242, or other suitable material. The actuator 620 may provide linear movement for the stem 622, and thus, the attached valve plug 632. For example, the actuator 620 may move the valve plug 632 upwards to a raised position, as shown by dotted line 672. In another example, the actuator 620 may move the valve plug 632 downwards to a lowered position, as shown by dotted line 674. The valve plug 632 may contact the valve seat of the housing 610 when in the lowered position. The valve plug 632 may have a seal 634 for forming a fluid tight closure when in contact with the valve seat of the housing 610 when the valve plug 632 is in the lowered position. Thus, fluid flowing into the inlet 612 does not flow through the interior working volume 602 and out the outlet 614 when the valve plug 632 is in the lowered position against the valve seat. Likewise, fluid flowing into the inlet 612 does may flow through the interior working volume 602 and out the outlet 614 when the valve plug 632 is in the raised position that is spaced from the valve seat.

The valve plug 632 may have a seat coating 652. The seat coating 652 is configured to protect the valve plug 632 from corrosive agents in the interior working volume 602 of the housing 610.

A bellows 642 may be disposed in the interior working volume 602 of the housing 610. The bellows 642 may have an accordion shaped and have an interior bellows area 644. For example, the bellows 642 may be cylindrical or polygonal in cross-section, circumscribing the interior bellows area 644. One end of the bellows 642 may be sealingly attached to the valve plug 632. The other end of the bellows 642 may be sealingly attached to either the housing 610 or the bonnet 618. Thus, a seal may be created between the valve plug 632 and the bonnet 618 to prevent fluids in the interior working volume 602 from entering the interior bellows area 644 defined inside the bellows 642 and the fluid exiting through the center opening 635 in the bonnet 618. The bellows 642 may be formed from stainless steel, such a 304 SST, INCONEL® 625, Haynes 242, or other suitable material. The bellows 642 may have a bellows coating 654. The bellows coating 654 may be exposed to the fluids disposed in the interior working volume 602 of the housing 610. The bellows coating 654 is configured to protect the bellows 642 from corrosive agents in the interior working volume 602 of the housing 610.

The chamber components may be protected by the various coatings, such as the valve body coating 650, seat coating 652, bellows coating 654 and flange coatings 656, 657, from reacting with corrosive agents, such as fluorine or chlorine, to form contamination in the interior volume of the processing chamber, such as chromium, titanium, and/or molybdenum. The coatings 650, 652, 654, 656, 657 may be monolithic and comprise materials which can be conformally deposited. The coatings may additionally, or alternately, be formed on other chamber components, such as the outer surface 198 of the lift pin bellows (not shown). The coatings 650, 652, 654, 656, 657 may be a carbon-containing material such as parylene (polyparaxylylene), for example parylene D or parylene C (chlorinated linear polyparaxylylene), parylene N (linear polyparaxylylene), and parylene X (cross-linked polyparaxylylene). Other carbon-containing materials that may be used include PEEK (polyether ether ketones) and amorphous carbon materials such as diamond-like carbon (DLC). The DLC may have a thickness of about 0.5 microns to about 50.0 microns, such as about 5 microns. The coatings 650, 652, 654, 656, 657 may alternately may be a material such as polytetrafluoroethylene (PTFE) or selective coatings of ceramic such as yttria stabilized zirconia or alumina, or aluminum silicon magnesium yttrium oxygen compound, or other material suitable for protecting against corrosive fluids in the processing chamber 100. The ceramics may have a thickness of about 0.5 microns to about 50.0 microns, such as about 25 microns. The coatings may also be formed from nickel. The nickel may have a thickness of about 0.5 microns to about 50.0 microns, such as about 10 microns.

Optionally, the coatings 650, 652, 654, 656, 657 may have multiple layers. The multiple layers of the coatings 650, 652, 654, 656, 657 may be formed from one or more of the aforementioned suitable coating materials. For example, the multiple layers may include two or more layers such as a bond layer and a protective layer. The bond layer may be suited to the chamber component to promote adhesion thereto while the protection layer may be provide insulation of said chamber component from the corrosive chamber environment or high temperatures among other chamber hazards.

In a first embodiment, the valve assembly 170 is protected from corrosive agents flowing therethrough. The housing 610 of the valve assembly 170 is formed from 304 SST. The interior working volume 602 of the housing 610 is covered with the valve body coating 650 in the form of nickel. The nickel coating may be about 10 microns thick.

The valve assembly 170 has flanges 616, 617 at the inlet 612 and outlet 614 formed from INCONEL® 625. The valve plug 632 is also formed from INCONEL® 625. The bellows 642 is formed from HAYNES® 242 alloy. The bellows 642 protects the stem 622 and actuator 620 from being exposed to fluids present in the interior working volume 602 of the housing 610.

In a second embodiment, the valve assembly 170 is protected from corrosive agents flowing therethrough. The housing 610 of the valve assembly 170 is formed from 304 SST. The interior working volume 602 of the housing 610 is covered with the valve body coating 650 in the form of nickel. The nickel coating may be about 10 microns thick. The valve assembly 170 has flanges 616, 617 at the inlet 612 and outlet 614 formed from INCONEL® 625. The flange coatings 656, 657 of the flanges 616, 617 may be formed from nickel. The nickel coating may be about 10 microns thick. The valve plug 632 is also formed from INCONEL® 625. The seat coating 652 of the valve plug 632 is formed from nickel. The nickel coating may be about 10 microns thick. The bellows 642 is formed from HAYNES® 242 alloy. The bellows 642 protects the stem 622 attaching the valve plug 632 to the actuator 620 from the corrosive agents.

In a third embodiment, the valve assembly 170 is protected from corrosive agents flowing therethrough. The housing 610 of the valve assembly 170 is formed from 304 SST. The interior working volume 602 of the housing 610 is covered with the valve body coating 650. The valve body coating 650 may be nickel having a thickness of about 10 microns. The valve assembly 170 has flanges 616, 617 at the inlet 612 and outlet 614 formed from SST. The flange coatings 656, 657 of the flanges 616, 617 may be formed from nickel. The nickel coating may be about 10 microns thick. The valve plug 632 is formed from SST. The seat coating 652 of the valve plug 632 may be formed from nickel. The nickel coating may be about 10 microns thick. The bellows 642 is also formed from SST. The bellows coating 654 of the bellows 642 may be formed from nickel. The nickel coating may be about 10 microns thick. The bellows 642 and bellows coating 654 protect the stem 622 attaching the valve plug 632 to the actuator 620 from the corrosive agents.

In a fourth embodiment, the valve assembly 170 is protected from corrosive agents flowing therethrough. The housing 610 of the valve assembly 170 is formed from 304 SST. The the interior working volume 602 of the housing 610 is covered in the valve body coating 650 in the form of a diamond-like coating (DLC). The DLC may be about 10 microns thick. The valve assembly 170 has flanges 616, 617 at the inlet 612 and outlet 614 formed from SST. The flange coatings 656, 657 of the flanges 616, 617 may formed from DLC. The DLC may be about 10 microns. The valve plug 632 is formed from SST. The seat coating 652 of the valve plug 632 may be formed from DLC. The DLC coating may be about 10 microns thick. The bellows 642 is also formed from SST. The bellows 642 is covered in about 10 microns thick DLC to form the bellows coating 654. The bellows 642 and bellows coating 654 protect the stem 622 attaching the valve plug 632 to the actuator 620 from the corrosive agents.

In yet other embodiments, the method and apparatus described above related to carbon film deposition at high temperatures, i.e., greater than 200 degrees Celsius, such as 300 degrees Celsius. After deposition of films and during a chamber cleaning process using fluorine or chlorine containing gases and high chamber temperatures, the SST and nickel-chromium alloy chamber components are protected by the coating from reacting with the corrosive fluorine or chlorine and degrading the chamber components as well as forming potential contamination, such as chromium, titanium, and/or molybdenum. For example, the bellows, substrate support, shaft, valve assembly or other chamber components may be formed from SST or INCONEL® 625 and further protected from the corrosive processing gases and high temperatures by the coatings described above. Use of the coating advantageously reduce the amount of Cr, Ti, and Mo entering and contamination the interior volume of the processing chamber due to attack of chamber components by corrosive agents. Additionally, the preventative maintenance life cycle for the chamber components are extended.

While the foregoing is directed to implementations of the present invention, other and further implementations of the invention may be devised without departing from the basic scope thereof, and the scope thereof is determined by the claims that follow.

We claim:

1. A bellows, comprising:
   a top mounting flange;
   a bottom mounting flange;
   a tubular accordion structure coupling the mounting flanges;
   a bonding layer disposed on an exterior treated surface of at least the tubular accordion structure, the bonding layer of at least one of chromium, titanium nitride or titanium; and
   a coating disposed on the bonding layer, the coating comprised of at least one of polytetrafluoroethylene (PTFE), parylene C, parylene D, diamond-like carbon, yttria stabilized zirconia, alumina, nickel, or aluminum silicon magnesium yttrium oxygen compound.

2. The bellows of claim 1, wherein the tubular accordion structure is fabricated from at least one of stainless steel or nickel-chromium alloy.

3. The bellows of claim 1, wherein the coating comprises the diamond-like carbon material and has a thickness of between about 0.5 microns to about 5 microns.

4. The bellows of claim 1, wherein the coating comprises a plurality of layers.

5. The bellows of claim 1, wherein the tubular accordion structure has an inside diameter of at least 0.70 inch to about 2.9 inch, and an axial range of motion of between about 1.2 inch to about 3.6 inch.

6. The bellows of claim 4, wherein the plurality of layers are fabricated from at least two different materials.

7. The bellows of claim 4, wherein each layer of the plurality of layers of the coating has a thickness of between about 0.25 microns to about 3 microns.

8. The bellows of claim 6 further comprising:
a second bonding layer disposed between at least two of the plurality of layers.

9. The bellows of claim 8, wherein the second bonding layer is formed from at least one of chromium or titanium or nickel or its alloys.

10. A valve assembly, comprising:
a housing having a valve seat and an interior working volume;
an actuator coupled to the housing;
a stem extending into the interior working volume of the housing, the stem coupled to the actuator;
a valve plug coupled to the stem in the interior working volume of the housing, the valve plug movable by the actuator between positions against and spaced from the valve seat;
a bellows circumscribing the stem and isolating the stem from the interior working volume of the housing, the bellows having a coating exposed to the interior working volume of the housing; and
a bonding layer disposed between the coating and the bellows.

11. The valve assembly of claim 10, wherein the coating is comprised of at least one of polytetrafluoroethylene (PTFE), parylene C, parylene D, diamond-like carbon, yttria stabilized zirconia, alumina, nickel, or aluminum silicon magnesium yttrium oxygen compound.

12. The valve assembly of claim 10, wherein the bellows is fabricated from at least one of stainless steel or nickel-chromium alloy.

13. The valve assembly of claim 10, wherein the coating comprises:
a diamond-like carbon material having a thickness of between about 0.5 microns to about 5 microns.

14. The valve assembly of claim 10, wherein the coating comprises a plurality of layers of at least two different materials.

15. The valve assembly of claim 10, wherein the coating on the bellows exposed to the interior working volume comprises:
a metal comprised of nickel.

16. The valve assembly of claim 10, wherein the coating comprises a plurality of layers with a separate bonding layer between each of the plurality of layers.

17. The valve assembly of claim 10, wherein an interior surface of the housing exposed to the interior working volume of the housing comprises a valve body coating.

18. The valve assembly of claim 10, wherein the tubular body further comprises:
a metal coating comprised of nickel.

19. The valve assembly of claim 10, wherein the housing and the valve plug, further comprises:
a metal coating comprised of nickel.

* * * * *